(12) United States Patent
Li

(10) Patent No.: US 11,961,845 B2
(45) Date of Patent: Apr. 16, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Xue Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 578 days.

(21) Appl. No.: 17/058,166

(22) PCT Filed: Sep. 17, 2020

(86) PCT No.: PCT/CN2020/115727
§ 371 (c)(1),
(2) Date: Nov. 24, 2020

(87) PCT Pub. No.: WO2022/032797
PCT Pub. Date: Feb. 17, 2022

(65) Prior Publication Data
US 2022/0223628 A1   Jul. 14, 2022

(30) Foreign Application Priority Data

Aug. 14, 2020   (CN) .......................... 202010818680.3

(51) Int. Cl.
*H01L 27/12* (2006.01)
*H01L 23/00* (2006.01)

(52) U.S. Cl.
CPC ........ *H01L 27/1244* (2013.01); *H01L 23/562* (2013.01)

(58) Field of Classification Search
CPC ....... H01L 21/56; H01L 23/13; H01L 23/291; H01L 23/315; H01L 23/3178; H01L 23/562; H01L 27/1218; H01L 27/1244; H01L 27/1248; H01L 2223/54486; H01L 21/78–786; H01L 33/52–56; H01L 2933/005; H10K 59/10;
(Continued)

(56) References Cited

U.S. PATENT DOCUMENTS 10,396,313 B2    8/2019 Cho
10,553,819 B2 *  2/2020 Kim ...................... H10K 59/122
(Continued)

FOREIGN PATENT DOCUMENTS

CN    106653818    5/2017
CN    107359275    11/2017
(Continued)

*Primary Examiner* — Cuong B Nguyen
*Assistant Examiner* — Anthony A Pulatov

(57) ABSTRACT

A display panel and a display device are provided. In a frame region, the display panel includes a first organic base substrate, an inorganic base substrate, a second organic base substrate, a first inorganic layer, and an encapsulation layer stacked in sequence, and a first groove portion passing through the first inorganic layer and a second groove portion extending to the second organic base substrate. An orthographic projection of the first groove portion projected on the first organic base substrate falls within and is less than an orthographic projection of the second groove portion projected on the first organic base substrate.

12 Claims, 4 Drawing Sheets

(58) Field of Classification Search
CPC .......... H10K 50/844–8445; H10K 50/00–868; H10K 59/00–18; H10K 59/121–1216; H10K 59/127–1275; H10K 2101/40; H10K 2101/10; H10K 2101/27; H10K 2101/90; H10K 2101/00; H10K 2101/30; H10K 2101/50; H10K 30/865; H10K 85/00–791; H10K 2102/301–331; H10K 2102/341; H10K 2102/361; H10K 2102/351; H10K 70/00; H10K 71/831–861; H10K 71/00; H10K 77/10–111

See application file for complete search history.

(56) References Cited

U.S. PATENT DOCUMENTS

| | | | | |
|---|---|---|---|---|
| 10,615,369 | B2* | 4/2020 | Choi | H10K 59/123 |
| 10,707,282 | B1* | 7/2020 | Yang | H10K 50/84 |
| 10,903,293 | B2* | 1/2021 | Jeong | H10K 50/11 |
| 10,978,526 | B2* | 4/2021 | Qin | H10K 50/844 |
| 11,050,041 | B2* | 6/2021 | Choi | H10K 59/124 |
| 2019/0081273 | A1* | 3/2019 | Sung | H10K 50/80 |
| 2019/0189731 | A1* | 6/2019 | Managaki | H10K 50/844 |
| 2019/0245159 | A1* | 8/2019 | Kim | H10K 50/8426 |
| 2019/0334120 | A1* | 10/2019 | Seo | H10K 50/8426 |
| 2020/0052051 | A1* | 2/2020 | Lee | H10K 59/124 |
| 2020/0106045 | A1* | 4/2020 | Han | H10K 59/65 |
| 2020/0328376 | A1* | 10/2020 | Seo | H10K 59/122 |
| 2021/0020864 | A1* | 1/2021 | Huang | H10K 59/122 |
| 2021/0193974 | A1* | 6/2021 | Chen | H10K 59/12 |

FOREIGN PATENT DOCUMENTS

| | | | | |
|---|---|---|---|---|
| CN | 108281570 | | 7/2018 | |
| CN | 108598287 | | 9/2018 | |
| CN | 109638019 | | 4/2019 | |
| CN | 110265443 | | 9/2019 | |
| CN | 110429193 | | 11/2019 | |
| CN | 110518046 A | * | 11/2019 | |
| CN | 110993660 A | * | 4/2020 | ......... H01L 27/3244 |
| CN | 111261643 | | 6/2020 | |
| CN | 111403621 | | 7/2020 | |
| CN | 111430442 | | 7/2020 | |
| CN | 109659444 B | * | 4/2021 | ......... H01L 27/3244 |

* cited by examiner

DISPLAY PANEL AND DISPLAY DEVICE

RELATED APPLICATIONS

This application is a National Phase of PCT Patent Application No. PCT/CN2020/115727 having International filing date of Sep. 17, 2020, which claims the benefit of priority of Chinese Patent Application No. 202010818680.3 filed on Aug. 14, 2020. The contents of the above applications are all incorporated by reference as if fully set forth herein in their entirety.

FIELD AND BACKGROUND OF THE INVENTION

The present invention relates to the field of display technologies, and in particular, to a display panel and a display device.

With development of technologies and improvement of people's quality of life, narrow frames and full screens have gradually become development trends in the field of display technologies.

To achieve full-screen display, it is necessary to increase screen-to-body ratio of display panels and reduce frame sizes of the display panels. In the prior art, as shown in FIG. 1, a frame region of a display panel generally comprises a wiring region 101, an effective encapsulation region 102, an anti-cracking region 103, and a cutting region 104. The display panel comprises a base substrate 110, a first inorganic layer 120, a second inorganic layer 130, a metal wiring layer 140, an organic layer 150, and an encapsulation layer 160 which are stacked in sequence from bottom to top. In the anti-cracking region 103, the second inorganic layer 130 is arranged in a ravine shape. The organic layer 150 is filled in a ravine to block cracks generated in an inorganic film layer during a cutting process, and prevent the cracks from extending to a display region of the display panel and causing display abnormalities. However, the encapsulation layer 160 will also have cracks during the cutting process, and the cracks generated by the encapsulation layer 160 will also extend to the display region of the display panel. Therefore, a longer effective encapsulation region 102 is designed to extend a crack extending path and try to prevent the cracks from extending to the display region of the display panel. The longer effective encapsulation region 102 increases a size of the frame region of the display panel and affects a narrow frame design of the display panel.

Therefore, current display panels have the problem of excessively wide frames, which needs to be solved.

The present invention provides a display panel and a display device to improve a problem of excessively wide frames in current display panels.

SUMMARY OF THE INVENTION

The present invention provides a display panel. The display panel comprises a display region and a frame region, wherein in the frame region, the display panel comprises:

a base substrate comprising a first organic base substrate, a second organic base substrate, and an inorganic base substrate disposed between the first organic base substrate and the second organic base substrate;

a first inorganic layer defined on the second organic base substrate;

an encapsulation layer defined on the first inorganic layer; and a groove passing through the first inorganic layer and extending to the second organic base substrate, wherein the groove comprises a first groove portion passing through the first inorganic layer and a second groove portion extending to the second organic base substrate, an orthographic projection of the first groove portion projected on the first organic base substrate falls within an orthographic projection of the second groove portion projected on the first organic base substrate and is less than an area of the orthographic projection of the second groove portion projected on the first organic base substrate.

In the display panel provided in the present invention, the frame region comprises a wiring region, an effective encapsulation region, and a cutting region, the effective encapsulation region is disposed between the wiring region and the cutting region, and the groove is defined in the cutting region.

In the display panel provided in the present invention, the encapsulation layer is disconnected at the groove.

In the display panel provided in the present invention, the encapsulation layer is connected at the groove.

In the display panel provided in the present invention, a diameter of a portion of the second groove portion away from the first groove portion is greater than a diameter of a portion close to the first groove portion.

In the display panel provided in the present invention, a bottom surface of the second groove portion is disposed in the second organic base substrate.

In the display panel provided in the present invention, the second groove portion passes through the second organic base substrate, and a bottom surface of the second groove portion coincides with a contact surface of the second organic base substrate and the inorganic base substrate.

In the display panel provided in the present invention, in the frame region, a number of the groove is only one.

In the display panel provided in the present invention, in the frame region, a number of the groove comprises at least two.

In the display panel provided in the present invention, the groove is provided at a cutting line.

Meanwhile, the present invention provides a display device. The display device comprises a display panel, wherein the display panel comprises a display region and a frame region, wherein in the frame region, the display panel comprises:

a base substrate comprising a first organic base substrate, a second organic base substrate, and an inorganic base substrate disposed between the first organic base substrate and the second organic base substrate;

a first inorganic layer defined on the second organic base substrate;

an encapsulation layer defined on the first inorganic layer; and a groove passing through the first inorganic layer and extending to the second organic base substrate, wherein the groove comprises a first groove portion passing through the first inorganic layer and a second groove portion extending to the second organic base substrate, an orthographic projection of the first groove portion projected on the first organic base substrate falls within an orthographic projection of the second groove portion projected on the first organic base substrate and is less than an area of the orthographic projection of the second groove portion projected on the first organic base substrate.

In the display device provided in the present invention, the frame region comprises a wiring region, an effective encapsulation region, and a cutting region, the effective encapsulation region is disposed between the wiring region and the cutting region, and the groove is defined in the cutting region.

In the display device provided in the present invention, the encapsulation layer is disconnected at the groove.

In the display device provided in the present invention, the encapsulation layer is connected at the groove.

In the display device provided in the present invention, a diameter of a portion of the second groove portion away from the first groove portion is greater than a diameter of a portion close to the first groove portion.

In the display device provided in the present invention, a bottom surface of the second groove portion is disposed in the second organic base substrate.

In the display device provided in the present invention, the second groove portion passes through the second organic base substrate, and a bottom surface of the second groove portion coincides with a contact surface of the second organic base substrate and the inorganic base substrate.

In the display device provided in the present invention, in the frame region, a number of the groove is only one.

In the display device provided in the present invention, in the frame region, a number of the groove comprises at least two.

In the display device provided in the present invention, the groove is provided at a cutting line.

The present invention provides a display panel and a display device. The display panel comprises a display region and a frame region. In the frame region, the display panel comprises a base substrate comprising a first organic base substrate, a second organic base substrate, and an inorganic base substrate disposed between the first organic base substrate and the second organic base substrate; a first inorganic layer defined on the second organic base substrate; an encapsulation layer defined on the first inorganic layer; and a groove passing through the first inorganic layer and extending to the second organic base substrate. The groove comprises a first groove portion passing through the first inorganic layer and a second groove portion extending to the second organic base substrate. An orthographic projection of the first groove portion projected on the first organic base substrate falls within an orthographic projection of the second groove portion projected on the first organic base substrate and is less than an area of the orthographic projection of the second groove portion projected on the first organic base substrate. The first groove portion and the second groove portion form a convex inscribed structure. When the display panel is cut, the first inorganic layer generates cutting cracks and extends outward. When the cutting cracks extend to a position of the groove, since the groove passes through the first inorganic layer and the first inorganic layer is disconnected at the groove, the cutting cracks cannot pass through the groove and continue to extend, preventing the problem that the cutting cracks of the first inorganic layer extend to the display region of the display panel and damage the display panel. Meanwhile, the cutting cracks are generated in an encapsulation layer during cutting and extend outward. Due to the groove of the convex inscribed structure, the cutting cracks are difficult to extend out of a groove region, preventing the problem that the cutting cracks of the encapsulation layer extend to the display region of the display panel and damage the display panel, and at the same time achieves an effect of an anti-cracking region and the longer effective encapsulation region in the prior art. Compared with the display panel of the prior art, the display panel provided by the present invention retains a width of a wiring region and a cutting region, removes the anti-cracking region, and reduces a size of the effective encapsulation region, thereby reducing a size of an entire frame region.

BRIEF DESCRIPTION OF THE SEVERAL VIEWS OF THE DRAWINGS

The following describes specific implementations of the present invention in detail with reference to accompanying drawings, which will make technical solutions and other beneficial effects of the present invention obvious.

DESCRIPTION OF SPECIFIC EMBODIMENTS OF THE INVENTION

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

In view of a problem of excessively wide frames of current display panels, the present invention provides a display panel that can alleviate the problem.

Figure 1:
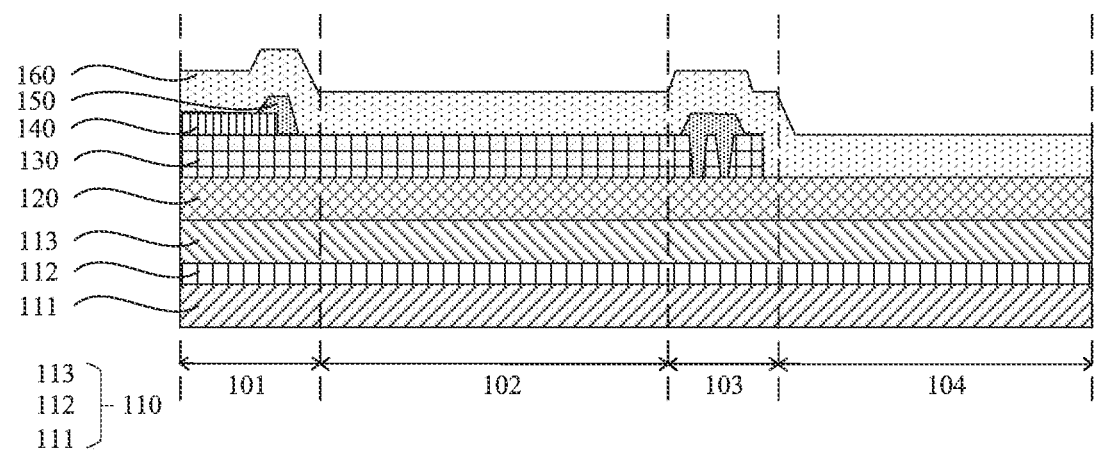
FIG. 1 is a schematic structural view of a of a display panel in the prior art.
Figure 2:
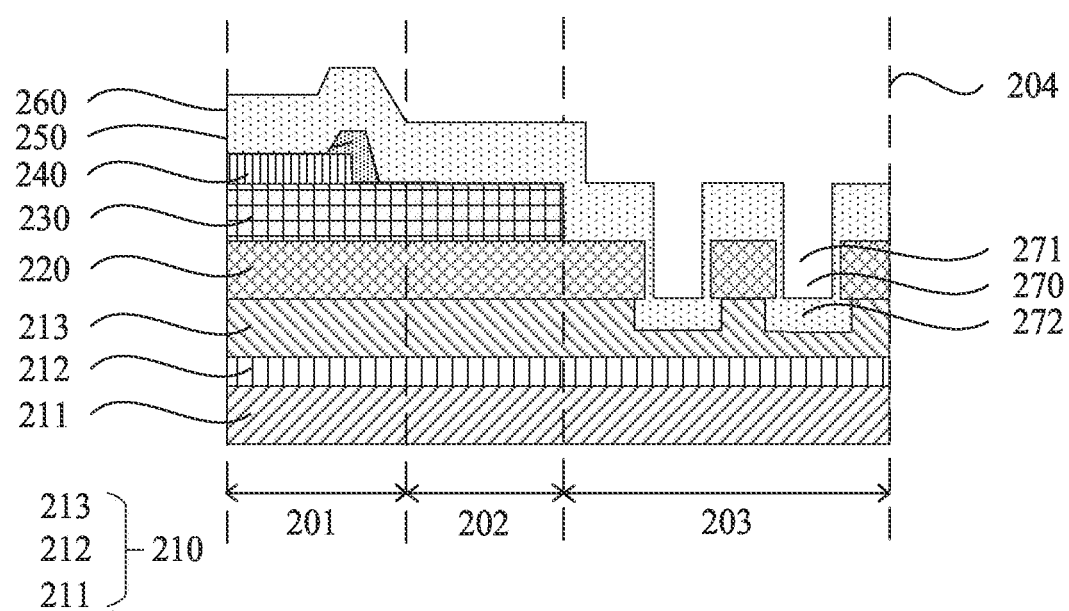
FIG. 2 is a schematic view of a first structure of a display panel provided by an embodiment of the present invention.
Figure 3:
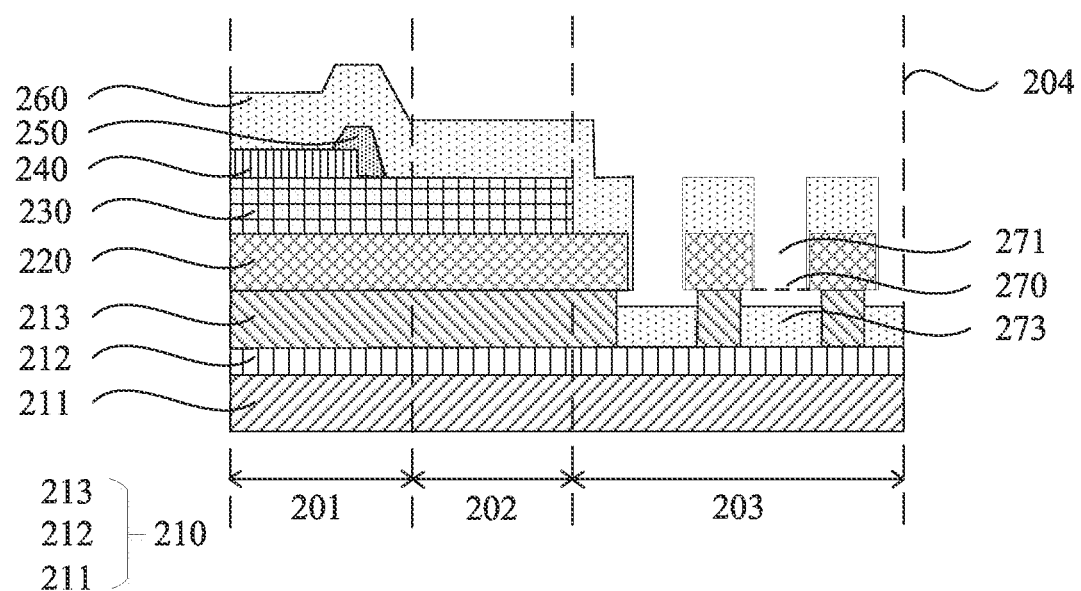
FIG. 3 is a schematic view of a second structure of the display panel provided by the embodiment of the present invention.
Figure 4:
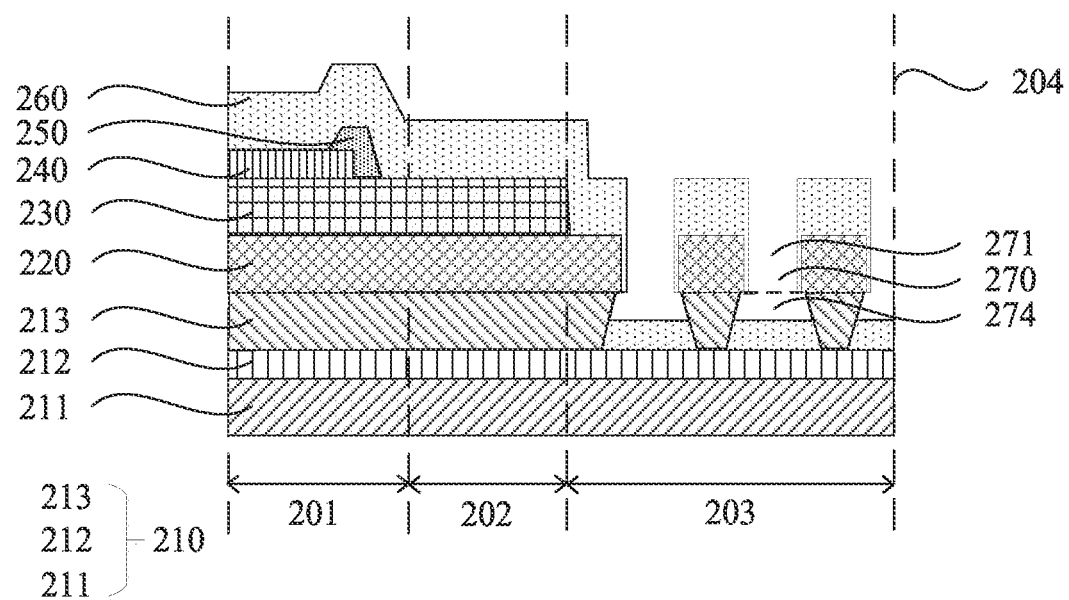
FIG. 4 is a schematic view of a third structure of the display panel provided by the embodiment of the present invention.

In an embodiment, as shown in FIG. 2 to FIG. 4, the display panel provided by the present invention comprises a display region (not shown) and a frame region. The frame region comprises a wiring region 201, an effective encapsulation region 202, and a cutting region 203. The effective encapsulation region 202 is disposed between the wiring region 201 and the cutting region 203. In the cutting region 203, the display panel comprises:

a base substrate 210 comprising a first organic base substrate 211, a second organic base substrate 213, and an inorganic base substrate 212 disposed between the first organic base substrate 211 and the second organic base substrate 213;

a first inorganic layer 220 defined on the second organic base substrate 213;

an encapsulation layer 260 defined on the first inorganic layer 220; and a groove 270 passing through the first inorganic layer 220 and extending to the second organic base substrate, wherein the groove comprises a first groove portion 271 passing through the first inorganic layer 220 and a second groove portion (272, 273, 274) extending to the second organic base substrate 213, an orthographic projection of the first groove portion 271 on the first organic base substrate 211 falls within an orthographic projection of the second groove portion (272, 273, 274) on the first organic base substrate 211 and is less than an area of the orthographic projection of the second groove portion (272, 273, 274) on the first organic base substrate 211.

An embodiment of the present invention provides the display panel. In the cutting region, the display panel is provided with the first groove portion passing through the first inorganic layer and the second groove portion extending to the second organic base substrate. The orthographic projection of the first groove portion projected on the first organic base substrate falls within the orthographic projection of the second groove portion projected on the first organic base substrate and is less than the area of the orthographic projection of the second groove portion projected on the first organic base substrate. The first groove portion and the second groove portion form a convex inscribed structure. When the display panel is cut, the first inorganic layer generates cutting cracks and extends outward. When the cutting cracks extend to a position of the groove, since the groove passes through the first inorganic layer and the first inorganic layer is disconnected at the groove, the cutting cracks cannot pass through the groove and continue to extend, preventing the problem that the cutting cracks of the first inorganic layer extend to the display area of the display panel and damage the display panel. Meanwhile, the cutting cracks are generated in an encapsulation layer during cutting and extend outward. Due to the groove of the convex inscribed structure, the cutting cracks are difficult to extend out of a groove region, preventing the problem that the cutting cracks of the encapsulation layer extend to the display region of the display panel and damage the display panel, and at the same time achieves an effect of anti-cracking region and the longer effective encapsulation region in the prior art. Compared with the display panel of the prior art, the display panel provided by the present invention retains a width of a wiring region and a cutting region, removes the anti-cracking region, and reduces a size of the effective encapsulation region, thereby reducing a size of an entire frame region.

The wiring region 201 is disposed adjacent to the display region of the display panel, that is, the effective encapsulation region 202 and the cutting region 203 are sequentially away from the display region of the display panel. In the embodiment provided in the present invention, a width of the wiring region 201 is same as a width of the wiring region 101 in the prior art. As shown in FIG. 2 to FIG. 4, in the wiring region 201, the display panel comprises: the base substrate 210 comprising the first organic base substrate 211, the inorganic base substrate 212, and the second inorganic base substrate 213. The first inorganic layer 220 is defined on the second organic base substrate 213. A second inorganic layer 230 is disposed on the first inorganic layer 220. A metal wiring layer 240 is disposed on the second inorganic layer 230. An organic layer 250 is disposed on the metal wiring layer 240 and covers an edge of the metal wiring layer 240. The encapsulation layer 260 is disposed on the organic layer 250 and covers the metal wiring layer 240, the organic layer 250, and the second inorganic layer 230.

The effective encapsulation region 202 is disposed adjacent to the wiring region 201 and far away from the display region. As shown in FIG. 2 to FIG. 4, in the effective encapsulation region 202, the display panel comprises: the base substrate 210 comprising the first organic base substrate 211, the inorganic base substrate 212, and the second inorganic base substrate 213. The first inorganic layer 220 is defined on the second organic base substrate 213. The encapsulation layer 260 is disposed on the second inorganic layer 230. In the effective encapsulation region 202, the second inorganic layer 230 is in close contact with the encapsulation layer 260, thereby forming a good packaging effect of the display panel.

Materials of the first organic base substrate 211 and the second organic base substrate 213 are usually organic polymer materials such as polyacetamide and polyethylene terephthalate, which realize flexibility of the display panel. A material of the inorganic base substrate 212 is generally silicon oxide or silicon nitride to maintain rigidity and support performance of the base substrate.

A material of the first inorganic layer 220 is generally silicon oxide (SiNx), silicon nitride oxide (SiOx), or silicon oxynitride (SiNO), and a stacked structure of silicon nitride and silicon oxide is usually adopted. Silicon nitride has strong ion barrier capacity and good water and oxygen barrier capacity, which can effectively prevent impurities from diffusing into the display panel during a thermal process, and silicon oxide has good interface properties. The second inorganic layer 230 is similar to the first inorganic layer 220.

The metal wiring layer 240 comprises metal wires. A material of the metal wire can be metal molybdenum, aluminum, copper, titanium, chromium, silver, or their mixtures. The metal wiring layer 240 can be a single-layer structure, such as single-layer metal copper, single-layer metal aluminum, single-layer metal copper, etc.; it can be a dual-layer structure, such as aluminum/molybdenum laminate structure, aluminum/titanium laminate structure, copper/titanium laminate structure; it can also be a three-layer structure, such as molybdenum/aluminum/molybdenum laminate structure, titanium/aluminum/titanium laminate structure, titanium/copper/titanium laminate structure, etc.

The organic layer 250 covers the edge of the metal wiring layer 240 to protect the metal wires. The material of the organic layer 250 comprises but is not limited to polyimide resin, epoxy resin, acrylic resin, or tetrafluoroethylene-perfluoroalkoxy vinyl ether copolymer.

The encapsulation layer 260 is configured to encapsulate an entire display panel to prevent foreign particles or water and oxygen from entering the display panel, while protecting the display panel from external damage. A material of the encapsulation layer 260 is an inorganic material, which is similar to the first inorganic layer 220 and the second inorganic layer 230, and is generally silicon oxide, silicon nitride, silicon oxide, or silicon oxynitride.

The cutting region 203 is a region reserved for cutting on the display panel, comprising a standard line for alignment cutting—a cutting line 204, in order to ensure cutting accuracy and heat-affected region, etc. In the embodiment of the present invention, a width of the cutting region 203 is the same as a width of the cutting region 104 in the prior art. A structure of the groove 270 in the cutting region 203 is different, and an effect on the display panel will be different.

In a first embodiment, as shown in FIG. 2, the first groove portion 271 passes through the first inorganic layer 220, the second groove portion 272 is disposed in the second organic base substrate 213, and a bottom surface of the second groove portion 272 is disposed in the second organic base substrate 213.

In the display panel provided in the embodiment, the first groove portion 271 passes through the first inorganic layer 220, so that the first inorganic layer 220 is disconnected at a position of the first groove portion 271. When the display panel is cut along the cutting line 204, the first inorganic layer 220 generates a cutting crack from a cutting position, and the cutting crack will extend to the effective encapsulation region 202. When the cutting crack extends to the first groove portion 271, due to the disconnection of the first inorganic layer 220, the cutting crack cannot go around the groove and continue to extend, and the cutting crack generated by the first inorganic layer 220 will stop in the first groove portion 271. That is, with the first groove portion 271 as a limit, there will be no cutting cracks in the first inorganic layer 220 in a region opposite to the cutting position, which prevents a problem that the cutting crack of the first inorganic layer 220 extend to the display region of the display panel and damage the display panel.

In addition, due to the orthographic projection of the first groove portion 271 on the first organic base substrate 211 falling within the orthographic projection of the second groove portion 272 on the first organic base substrate 211 and being less than the area of the orthographic projection of the second groove portion 272 on the first organic base substrate 211, thus the entire groove 270 forms a convex inscribed structure. When the display panel is cut along the cutting line 204, the encapsulation layer 260 generates a cutting crack from a cutting position, and the cutting crack extends to the effective encapsulation region 202. When the cutting crack extends to the groove 270, due to an existence of the convex inscribed structure of the groove 270, it is difficult for the cutting crack to extend out of the groove region, and the cutting crack generated by the encapsulation layer 260 will stop at the groove 270. That is, with the groove 270 as a limit, there will be no cutting cracks in the encapsulation layer 260 in a region opposite to the cutting position, which prevents a problem that the cutting crack of the encapsulation layer 260 extend to the display region of the display panel and damage the display panel.

In an embodiment, as shown in FIG. 2, the encapsulation layer 260 is connected at the groove 270. However, due to the existence of the convex inscribed structure of the groove 270, during a forming process of the encapsulation layer 260, more encapsulation layer material is deposited in the second groove portion 272, so that the encapsulation layer material on sidewalls of the first groove portion 271 is reduced. That is, a lateral thickness of the encapsulation layer on the sidewalls of the first groove portion 271 becomes thinner. When the cutting crack of the encapsulation layer extends to the sidewalls of the first groove portion 271, an inertial force of the cutting crack will be greatly weakened. When the cutting crack extends through the sidewalls of the first groove portion 271 to the effective encapsulation region, the inertial force of the cutting crack will not be sufficient to drive the encapsulation layer 260 in the effective encapsulation region to crack, which greatly reduce the risk of the cutting cracks of the encapsulation layer 260 extending outside the groove region. In addition, when the cutting crack generated by the encapsulation layer 260 extends in the groove 270, it will be dispersed by an inertial force extending along a side of the second groove portion 272 in a lateral direction and an inertial force extending along a side of the first groove portion 271 in a longitudinal direction. The former will greatly disperse the inertial force of the cutting crack, making it difficult for the cutting crack generated by the encapsulation layer 260 to extend out of the groove region, preventing the problem of the cutting crack of the encapsulation layer 260 extending to the display region of the display panel and damaging the display panel.

In another embodiment, as shown in FIG. 3 and FIG. 4, the encapsulation layer 260 is disconnected at the groove 270, That is, the encapsulation layer 260 in the groove 270 is disconnected from the encapsulation layer 260 outside the groove 270. When the display panel is cut along the cutting line 204, the encapsulation layer 260 in the groove 270 generates the cutting crack from the cutting position and stops when it extends to a wall of the groove 270. That is, there will be no cutting cracks in the encapsulation layer 260 outside the groove 270, which prevents the cutting cracks of the encapsulation layer 260 from extending to the display region of the display panel and damaging the display panel, thereby further ensuring quality of the display panel.

In an embodiment, as shown in FIG. 3, a diameter of a portion of the second groove portion 273 close to the first groove portion 271 is the same as a diameter of a portion away from the first groove portion 271, and both are greater than a diameter of the first groove portion 271. The encapsulation layer 260 is disconnected at a connection of the first groove portion 271 and the second groove portion 273.

In another embodiment, as shown in FIG. 4, the diameter of the portion of the second groove portion 274 away from the first groove portion 271 is greater than the diameter of the portion close to the first groove portion 271, a diameter of a contact position of the second groove portion 274 and the first groove portion 271 may be the same as the diameter of the first groove portion 271, or may be larger than the diameter of the first groove portion 271. Compared with the embodiment shown in FIG. 3, in the embodiment, the structure of the second groove portion 274 is designed so that under a same cross-sectional area, a diameter of a bottom of the second groove portion 274 is greater than that of the second groove portion 273. When a volume of the material of the encapsulation layer 260 deposited in the groove 270 is the same, a thickness of the encapsulation layer 260 in the second groove portion 274 is greater than a thickness in the second groove portion 273, which is more conducive to disconnect the encapsulation layer 260 at the second groove portion 274. On the other hand, the structural design of the second groove portion 274 that is narrow and wide at the bottom is more unfavorable for the material of the encapsulation layer 260 to be deposited on the sidewalls of the second groove portion 274. This also blocks the connection between an encapsulation layer at the bottom of the second groove portion 274 and an encapsulation layer on the first groove portion 271, so that the encapsulation layer 260 is disconnected at the second groove portion 274.

In an embodiment, in the cutting region 203, the groove 270 is only provided as one. The groove 270 can be provided at a non-cutting line 204 or at the cutting line 204. When the groove 270 is defined at the cutting line 204 and the display panel is cut along the cutting line 204, since there is no first inorganic layer 220 in the groove 270 at the cutting position, no cutting cracks will occur in the first inorganic layer 220. Therefore, there is no problem of the cutting cracks of the first inorganic layer 220 extending to the display region of the display panel and damaging the display panel. During cutting, the encapsulation layer 260 generates cutting cracks and extends outward. Due to the grooves of the convex inscribed structure, it is difficult for the cutting cracks to extend out of the groove region, which prevents the problem that the cutting cracks of the encapsulation layer 260 extend to the display region of the display panel and damage the display panel, thereby further ensuring the quality of the display panel.

In another embodiment, in the cutting region 203, the groove 270 is provided as at least two. The grooves 270 may all be defined at the non-cutting line 204, or there may be one groove 270 defined at the cutting line 204. The design of multiple grooves 270 further considers an influence of cutting errors. When one of the grooves 270 of the display panel loses its blocking effect on the cutting cracks, other grooves 270 close to the display region of the display panel can also block the cutting cracks, thereby further ensuring the quality of the display panel.

In the second embodiment, as shown in FIG. 3 and FIG. 4, the groove 270 passes through the first inorganic layer 220 and the second organic base substrate 213 at the same time.

A bottom surface of a second groove portion (273, 274) coincides with a contact surface of the second organic base substrate 213 and the inorganic base substrate 212.

Similar to the first embodiment, in the display panel provided in the embodiment, the first groove portion 271 also passes through the first inorganic layer 220, so that the first inorganic layer 220 is disconnected at the position of the first groove portion 271. When the display panel is cut along the cutting line 204, the first inorganic layer 220 generates a cutting crack from the cutting position, and the cutting crack extends to the effective encapsulation region 202. When the cutting crack extends to the first groove portion 271, due to the disconnection of the first inorganic layer 220, the cutting crack cannot go around the groove and continue to extend, and the cutting crack generated by the first inorganic layer 220 will stop in the first groove portion 271. That is, with the first groove portion 271 as the limit, there will be no cutting cracks in the first inorganic layer 220 in the region opposite to the cutting position, which prevents the problem that the cutting crack of the first inorganic layer 220 extend to the display region of the display panel and damage the display panel.

Different from the first embodiment, the second groove portion (273, 274) passes through the second organic base substrate 213, and the bottom surface of the second groove portion (273, 274) coincides with the contact surface of the second organic base substrate 213 and the inorganic base substrate 212. A step difference of the second groove portion (273, 274) is further increased, which further ensures the disconnection effect of the encapsulation layer 260 at the second groove portion (273, 274). Similarly, when the display panel is cut along the cutting line 204, the encapsulation layer 260 generates a cutting crack from the cutting position, and the cutting crack extends to the effective encapsulation region 202. When the cutting crack extends to the groove 270, the cutting crack will stop at the groove 270. That is, with the groove 270 as the limit, there will be no cutting cracks in the encapsulation layer 260 in the region opposite to the cutting position, which prevents the problem of the cutting cracks in the encapsulation layer 260 extending to the display region of the display panel and damaging the display panel.

The above embodiments are only illustrative of the display panel provided by the present invention, and those skilled in the art can structure the above embodiments to synthesize other embodiments, which are not limited here.

In the display panel provided by the embodiment of the present invention, the structural design of the first groove portion 271 passing through the first inorganic layer 220 replaces an anti-cracking region 103 of a display panel in the prior art, so that a size of a frame region of the display panel is reduced by 30-50 um compared with the prior art (a width of the anti-cracking region 103 of the display panel in the prior art is 30-50 um). Meanwhile, compared with the prior art, in the anti-cracking region 103, only the second inorganic layer 130 is provided with the groove for organic layer filling, which can only block the cracks generated in the second inorganic layer 130 during the cutting process, and cannot prevent the display abnormalities caused by the cracks generated in the first inorganic layer 120 extending to the display region of the display panel. In the embodiment of the present invention, a boundary of the second inorganic layer 230 is set in the effective encapsulation region 202 to prevent the possibility of the cutting cracks in the second inorganic layer 230. A groove structure is provided for the first inorganic layer 220 in the cutting region 203, which blocks an extending path of the cutting cracks of the first inorganic layer 220, and blocking effect on the cutting cracks of the first inorganic layer 220 and the second inorganic layer 230 is more direct and effective.

The design of the second groove portion (272, 273, 274) extending to the second organic base substrate 213 makes the cutting cracks generated by the encapsulation layer 260 stop at the groove 270, reaching a long effective encapsulation region in the prior art. Therefore, the effective encapsulation region 202 of the display panel provided in the embodiment does not need to be long, and a size of the effective encapsulation region 202 is reduced by 100-200 um compared with the prior art. Meanwhile, compared with the prior art, the effective encapsulation region 102 is made longer to extend a crack extending path to prevent the cutting crack of the packaging region 160 from extending to the display region of the display panel, the display panel provided by the embodiment of the present invention directly blocks the extending path of the cutting crack in the packaging region 260, and the blocking effect on the cutting crack in the packaging region 160 is more direct and effective.

Compared with the prior art, the size of the entire frame region of the display panel provided by the embodiments of the present invention is reduced by 130-250 um.

Further, the embodiment of the present invention provides a manufacturing method for the display panel, which is used to manufacture the display panel shown above. In an embodiment, the manufacturing method of the display panel comprises:

Step S1, forming an array substrate;

Step S2, in a cutting region, etching a first inorganic layer at a predetermined position of the array substrate to expose a second organic base substrate to form a first groove portion;

Step S3, reacting oxygen with the exposed second organic base substrate to etch the second organic base substrate to form a second groove portion, wherein an orthographic projection of the second groove portion projected on the array substrate covers an orthographic projection of the first groove portion projected on the array substrate, and has a larger area than the orthographic projection of the first groove portion projected on the array substrate;

Step S4, forming an encapsulation layer, which is disconnected at the groove; and Step S5, cutting the display panel.

The embodiment of the present invention provides the manufacturing method for the display panel. In the manufacturing method, a first groove portion passing through the first inorganic layer and a second groove portion extending to the second organic base substrate are formed in the first inorganic layer in a cutting region, so that the entire groove forms a convex inscribed structure. When the display panel is cut, the first inorganic layer generates cutting cracks and extends outward. When extending to the position of the groove, since the groove passes through the first inorganic layer to disconnect the first inorganic layer at the groove, the cutting cracks generated by the first inorganic layer will not be able to bypass the groove and continue to extend, preventing the problem that the cutting crack of the first inorganic layer extends to the display region of the display panel and damages the display panel. Similarly, when cutting, the encapsulation layer generates a cutting crack and extends outward, and stops when it reaches the position of the groove, preventing the problem that the cutting crack of the encapsulation layer extends to the display region of the display panel and damages the display panel. A formation of the first groove portion achieves an effect of an anti-cracking region in the prior art, and a formation of the second groove portion achieves an effect of a longer effective encapsulation region in the prior art. Compared with the display panel of the prior art, by improving the cutting region, removing the anti-crack region, reducing the size of the effective encapsulation region, thereby reducing the size of the entire frame region.

In an embodiment, the second groove portion does not pass through the second organic base substrate, and the bottom surface of the second groove portion is disposed in the second organic base substrate.

In another embodiment, the second groove portion passes through the second organic base substrate, and the bottom surface of the second groove portion coincides with the contact surface of the second organic base substrate and the inorganic base substrate.

In an embodiment, there is only one predetermined position, that is, a formed display panel has only one groove. In an embodiment, the predetermined position is at the cutting line. In another embodiment, the predetermined position is at the non-cutting line.

In another embodiment, the predetermined position comprises at least two positions. That is, the formed groove of the display panel comprises at least two. In an embodiment, one of the predetermined positions is at the cutting line. In another embodiment, the predetermined positions are all at the non-cutting line.

The embodiment of the present invention further provides a display device. The display device comprises the display panel provided by the embodiment of the present invention. the display panel comprises the display region and the frame region, wherein in the frame region, the display panel comprises:

the base substrate comprising the first organic base substrate, the second organic base substrate, and the inorganic base substrate disposed between the first organic base substrate and the second organic base substrate;

the first inorganic layer defined on the second organic base substrate;

the encapsulation layer defined on the first inorganic layer; and the groove passing through the first inorganic layer and extending to the second organic base substrate, wherein the groove comprises the first groove portion passing through the first inorganic layer and the second groove portion extending to the second organic base substrate, the orthographic projection of the first groove portion projected on the first organic base substrate falls within the orthographic projection of the second groove portion projected on the first organic base substrate and is less than the area of the orthographic projection of the second groove portion projected on the first organic base substrate.

In an embodiment, the frame region comprises the wiring region, the effective encapsulation region, and the cutting region, the effective encapsulation region is disposed between the wiring region and the cutting region, and the groove is defined in the cutting region.

In an embodiment, the encapsulation layer is disconnected at the groove.

In an embodiment, the encapsulation layer is connected at the groove.

In an embodiment, the diameter of the portion of the second groove portion away from the first groove portion is greater than the diameter of the portion close to the first groove portion.

In an embodiment, the bottom surface of the second groove portion is disposed in the second organic base substrate.

In an embodiment, the second groove portion passes through the second organic base substrate, and the bottom surface of the second groove portion coincides with the contact surface of the second organic base substrate and the inorganic base substrate.

In an embodiment, in the frame region, a number of the groove is only one.

In an embodiment, in the frame region, a number of the groove comprises at least two.

In an embodiment, the groove is provided at the cutting line.

According to the above embodiment, it can be seen that:

The present invention provides the display panel, the manufacturing method thereof, and the display device. The display panel comprises the display region and the frame region. In the frame region, the display panel comprises the base substrate comprising the first organic base substrate, the second organic base substrate, and the inorganic base substrate disposed between the first organic base substrate and the second organic base substrate; the first inorganic layer defined on the second organic base substrate; the encapsulation layer defined on the first inorganic layer; and the groove passing through the first inorganic layer and extending to the second organic base substrate. The groove comprises the first groove portion passing through the first inorganic layer and the second groove portion extending to the second organic base substrate. The orthographic projection of the first groove portion projected on the first organic base substrate falls within the orthographic projection of the second groove portion projected on the first organic base substrate and is less than the area of the orthographic projection of the second groove portion projected on the first organic base substrate. When the display panel is cut, the first inorganic layer generates the cutting cracks and extends outward. When the cutting cracks extend to the position of the groove, since the groove passes through the first inorganic layer and the first inorganic layer is disconnected at the groove, the cutting cracks cannot pass through the groove and continue to extend, preventing the problem that the cutting cracks of the first inorganic layer extend to the display region of the display panel and damage the display panel. Meanwhile, the cutting cracks are generated in the encapsulation layer during cutting and extend outward. Due to the groove of the convex inscribed structure, the cutting cracks are difficult to extend out of the groove region, preventing the problem that the cutting cracks of the encapsulation layer extend to the display region of the display panel and damage the display panel, and at the same time achieves the effect of the anti-cracking region and the longer effective encapsulation region in the prior art. Compared with the display panel of the prior art, the display panel provided by the present invention retains the width of the wiring region and the cutting region, removes the anti-cracking region, and reduces the size of the effective encapsulation region, thereby reducing the size of the entire frame region.

In summary, although the present invention has been disclosed as above in preferred embodiments, the above preferred embodiments are not intended to limit the present invention. Those of ordinary skill in the art can make various changes and modifications without departing from the spirit and scope of the present invention. Therefore, the scope of protection of the present invention is subject to the scope defined by the claims.

What is claimed is:

1. A display panel, comprising:
a display region and a frame region, wherein in the frame region, the display panel comprises:
a base substrate comprising a first organic base substrate, a second organic base substrate, and an inorganic base substrate disposed between the first organic base substrate and the second organic base substrate;
a first inorganic layer formed on the second organic base substrate;
a second inorganic layer formed on the first inorganic layer;
an encapsulation layer formed directly on the first inorganic layer and the second inorganic layer; and
at least one groove passing through both the first inorganic layer and the second organic base substrate, wherein each of the at least one groove comprises a first groove portion passing through the first inorganic layer and a second groove portion passing through the second organic base substrate, a bottom surface of the second groove portion coincides with a top surface of the inorganic base substrate, and an orthographic projection of the first groove portion projected on the first organic base substrate falls within an orthographic projection of the second groove portion projected on the first organic base substrate and is less than an area of the orthographic projection of the second groove portion projected on the first organic base substrate;
wherein the encapsulation layer contacts with the second inorganic layer; and
wherein the encapsulation layer is disconnected at each of the at least one groove.

2. The display panel as claimed in claim 1, wherein the frame region comprises a wiring region, an effective encapsulation region, and a cutting region, the effective encapsulation region is disposed between the wiring region and the cutting region, and each of the at least one groove is formed in the cutting region.

3. The display panel as claimed in claim 1, wherein a diameter of a first portion of the second groove portion away from the first groove portion is greater than a diameter of a second portion of the second groove portion close to the first groove portion.

4. The display panel as claimed in claim 1, wherein in the frame region, a number of the at least one groove is only one.

5. The display panel as claimed in claim 1, wherein in the frame region, a number of the at least one groove is at least two.

6. The display panel as claimed in claim 1, wherein one groove of the at least one groove is provided at a cutting line.

7. A display device, comprising a display panel, wherein the display panel comprises a display region and a frame region, wherein in the frame region, the display panel comprises:
a base substrate comprising a first organic base substrate, a second organic base substrate, and an inorganic base substrate disposed between the first organic base substrate and the second organic base substrate;
a first inorganic layer formed on the second organic base substrate;
a second inorganic layer formed on the first inorganic layer;
an encapsulation layer directly formed on the first inorganic layer and the second inorganic layer; and
at least one groove passing through both the first inorganic layer and the second organic base substrate, wherein each of the at least one groove comprises a first groove portion passing through the first inorganic layer and a second groove portion passing through the second organic base substrate, a bottom surface of the second groove portion coincides with a top surface of the inorganic base substrate, and an orthographic projection of the first groove portion projected on the first organic base substrate falls within an orthographic projection of the second groove portion projected on the first organic base substrate and is less than an area of the orthographic projection of the second groove portion projected on the first organic base substrate;
wherein the encapsulation layer contacts with the second inorganic layer; and
wherein the encapsulation layer is disconnected at each of the at least one groove.

8. The display device as claimed in claim 7, wherein the frame region comprises a wiring region, an effective encapsulation region, and a cutting region, the effective encapsulation region is disposed between the wiring region and the cutting region, and each of the at least one groove is formed in the cutting region.

9. The display device as claimed in claim 7, wherein a diameter of a first portion of the second groove portion away from the first groove portion is greater than a diameter of a second portion of the second groove portion close to the first groove portion.

10. The display device as claimed in claim 7, wherein in the frame region, a number of the at least one groove is only one.

11. The display device as claimed in claim 7, wherein in the frame region, a number of the at least one groove is at least two.

12. The display device as claimed in claim 7, wherein one groove of the at least one groove is provided at a cutting line.

* * * * *